(12) United States Patent
Hendriks et al.

(10) Patent No.: US 10,338,473 B2
(45) Date of Patent: Jul. 2, 2019

(54) METHOD AND SYSTEM FOR FORMING A PATTERNED STRUCTURE ON A SUBSTRATE

(71) Applicant: Nederlandse Organisatie voor toegepast-natuurwetenschappelijk onderzoek TNO, 's-Gravenhage (NL)

(72) Inventors: Rob Jacob Hendriks, 's-Gravenhage (NL); Gari Arutinov, 's-Gravenhage (NL); Edsger Constant Pieter Smits, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 209 days.

(21) Appl. No.: 15/032,950

(22) PCT Filed: Oct. 29, 2014

(86) PCT No.: PCT/NL2014/050748
§ 371 (c)(1),
(2) Date: Apr. 28, 2016

(87) PCT Pub. No.: WO2015/065182
PCT Pub. Date: May 7, 2015

(65) Prior Publication Data
US 2016/0259250 A1 Sep. 8, 2016

(30) Foreign Application Priority Data

Oct. 30, 2013 (EP) .................................... 13190956
Dec. 16, 2013 (EP) .................................... 13197502

(51) Int. Cl.
*G03F 7/20* (2006.01)
*B41M 3/00* (2006.01)
*B41M 5/46* (2006.01)

(52) U.S. Cl.
CPC ........... *G03F 7/2008* (2013.01); *B41M 3/006* (2013.01); *B41M 5/46* (2013.01); *G03F 7/7015* (2013.01); *B41M 2205/14* (2013.01)

(58) Field of Classification Search
CPC ............................... G03F 7/2008; B41M 5/46
See application file for complete search history.

(56) References Cited

U.S. PATENT DOCUMENTS 6,529,284 B1 * 3/2003 Ganapathy ............... G06T 1/20
345/551
2004/0108047 A1 * 6/2004 Afzali-Ardakani .... B41M 5/265
156/230

(Continued)

FOREIGN PATENT DOCUMENTS

EP 0529362 A1 3/1993
EP 1735664 A1 12/2006

(Continued)

OTHER PUBLICATIONS

Feb. 5, 2015—International Search Report and Written Opinion of PCT/NL2014/050748.

*Primary Examiner* — Kathleen Duda
(74) *Attorney, Agent, or Firm* — Banner & Witcoff, Ltd.

(57) ABSTRACT

The present disclosure concerns a method and system for providing a patterned structure (3p) on an acceptor substrate 4). The method comprises providing a donor substrate (10) arranged between a light source (5) and an acceptor substrate (4). A mask (7) is arranged between the light source (5) and the donor substrate (10). The mask (7) comprises a mask pattern (7p) for patterning light (6). The patterned light (6p) impinging the donor substrate (10) causes the donor material (3) to be released from the donor substrate (10) and transfer to the acceptor substrate (4) to form the patterned structure (3p) thereon. The patterned light (6p) is divided by the mask pattern (7p) into a plurality of separate homogeneously sized beams (6b) simultaneously impinging the donor substrate (10) for causing the donor material (3) to be released from the donor substrate (10) in the form of separate homogeneously sized droplets (3d).

10 Claims, 5 Drawing Sheets

(56) References Cited

U.S. PATENT DOCUMENTS

| | | | |
|---|---|---|---|
| 2005/0081984 A1 | 4/2005 | Afzali-Ardakani et al. | |
| 2005/0191448 A1 | 9/2005 | Suh et al. | |
| 2007/0178402 A1 | 8/2007 | Lee et al. | |
| 2008/0026543 A1 | 1/2008 | Miyairi et al. | |
| 2014/0295085 A1* | 10/2014 | Ye | H01L 51/56 |
| | | | 427/299 |
| 2014/0333911 A1* | 11/2014 | Kang | G03F 7/2006 |
| | | | 355/67 |

FOREIGN PATENT DOCUMENTS

| | | |
|---|---|---|
| JP | H07-273003 A | 10/1995 |
| JP | 2007-206675 A | 8/2007 |
| JP | 2007-534012 A | 11/2007 |
| JP | 2008-053698 A | 3/2008 |
| JP | 2010-533977 A | 10/2010 |
| WO | 02/22372 A1 | 3/2002 |
| WO | 2009/012026 A2 | 1/2009 |

* cited by examiner

METHOD AND SYSTEM FOR FORMING A PATTERNED STRUCTURE ON A SUBSTRATE

CROSS-REFERENCE TO RELATED APPLICATIONS

This application is a U.S. National Stage application under 35 U.S.C. § 371 of International Application PCT/NL2014/050748 (published as WO 2015/065182 A1), filed Oct. 29, 2014, which claims priority to Application EP 13190956.6, filed Oct. 30, 2013, and to Application EP 13197502.1, filed Dec. 16, 2013. Benefit of the filing date of each of these prior applications is hereby claimed. Each of these prior applications is hereby incorporated by reference in its entirety.

TECHNICAL FIELD AND BACKGROUND

The present disclosure concerns a method and system for providing a patterned structure on a substrate.

Generally, printing of conductive pastes is based on a contacting method. For example, (rotary) screen printing comprises the printing of conductive pastes. Although quite high resolutions can be achieved, this method is based on contact. However, various device stacks such as OLEDs and OPV cells may not allow contacting as they contain a barrier stack. Accordingly a contactless method for providing a patterned structure is desired.

For example, inkjet printing has the advantage of being contactless. However, the nozzle size limits the usable particle size of conductive inks, and the maximum resolution is affected by the spreading (low viscosity) and drop size. In another example, Laser Induced Forward Transfer (LIFT) is a relatively new patterning technique to deposit high resolution conductive structures. However, laser systems are quite expensive and ultimately it is still based on drop on demand.

There remains a desire for improved control over fast and contactless patterning of a large area structure on a substrate.

SUMMARY

A first aspect of the present disclosure provides a method for providing a patterned structure on a substrate. The method comprises providing a donor substrate comprising a donor material between a light source and an acceptor substrate. The method further comprises providing a mask arranged between the light source and the donor substrate. The mask comprises a mask pattern for patterning light from the light source impinging the donor substrate. The patterned light matches the patterned structure to be created. Accordingly, the patterned light impinging the donor substrate causes the donor material to be released from the donor substrate and transfer to the acceptor substrate to form the patterned structure thereon. The patterned light is divided into a plurality of separate homogeneously sized beams simultaneously impinging the donor substrate for causing the donor material to be released from the donor substrate in the form of separate homogeneously sized droplets.

It is presently recognized that light induced transfer of material from a donor substrate to an acceptor substrate can in principle be used as a contactless method to quickly transfer large patterns of material at once. By using a mask between the light source and donor substrate, a patterned area of the donor material can be irradiated to be transferred simultaneously. However, it was found that without further adaptation, the process can be difficult to control because the transfer behaviour may be dependent on a size of the different areas that are transferred. For example, the energy needed to release an area of material may depend on the shear forces acting on the material to be transferred, which can be different for different area sizes. Furthermore, when a large area of material is transferred at once, the area may break up into debris while transferring which can lead to unpredictable patterning behaviour.

By dividing the light into a plurality of separate homogeneously sized beams, the reaction of the donor material to each beams can be more uniform and predictable. In particular, because the beams are each of the same size and energy, each droplet of donor material to be released can be of the same size and volume and the transfer characteristic can be more predictable. Furthermore, because there is a spacing in between the beams as they simultaneously impinge the donor substrate, the resulting droplets are also separate and do not influence each other while in transit thus further improving the predictability of the transfer characteristic. Accordingly, the material is released from the donor substrate in the form of separate homogeneously sized droplets. The well defined and separated droplets can merge together when colliding with the acceptor substrate to form larger structures. The improved control over the transfer of a large number of droplets at once thus provides a fast and contactless patterning of a large area structure on a substrate.

In one embodiment, the mask pattern comprises a plurality of pattern areas having different sizes corresponding to different sizes of areas of the patterned structure to be formed. By dividing the light that is patterned by the mask into a plurality separate homogeneous beams, the mask pattern with different areas sizes can nevertheless result in the formation of homogeneous droplet sizes. By dividing the mask pattern into separate homogenously sized pixels, the resulting light pattern can have separate homogeneously sized beams. A plurality of pixels can thus be arranged to form one pattern area of the plurality of differently sized pattern areas. For example, a pixelated mask can be produced by receiving a regular mask pattern comprising a plurality of pattern areas having different sizes corresponding to differently sized circuit elements to be formed and dividing the pattern areas into a plurality of separate homogeneously sized pixels. Alternative or in addition to dividing the mask pattern itself into pixels, a second mask can be provides that pixelates the light before or after the light traversing the first mask pattern having the differently sized pattern areas.

By homogeneously distancing the separate beams, the corresponding droplets can be deposited at homogeneous distances onto the acceptor substrate. When the transferred homogenous droplets arrive at the acceptor substrate, they may evenly spread on the substrate and thereby connect to neighbouring transferred droplets. Accordingly, an large area interconnecting patterned structure can be formed by the separate droplets connecting to each other. Typically, such interconnecting of neighbouring droplets can be achieved by providing a suitably small separation distance between neighbouring beams, for example related to a size of the beams, layer thickness of the donor material, viscosity of the donor material, and/or transfer velocity of the droplets. On the other hand, the separation distance is preferably large enough to allow the separate transfer of the droplets. Typically it is found advantageous to provide a separation distance between neighbouring beams on the order of the beam size or smaller, e.g. between 20-200% a size of the beams, preferably between 50-150%, even more preferably between 50-100%. When the beams are created by a pixelated mask, the beam size is typically proportional to a pixel size and the beam distance proportional to a pixel distance. Accordingly, a pixel size and distance are chosen such that a proper isolated droplet is ejected from the donor substrate.

When the beam is too small compared to the layer thickness of the donor material, shear forces may hinder the donor material to be properly released from the donor substrate. On the other hand, when the beam is too large, the area of material that is transferred may break up. To provide a well defined droplet that readily separates from the donor material, it is found that a size of the beams impinging the donor material on the donor substrate is preferably on the order of the layer thickness of the donor material or larger, e.g. a beam size (e.g. diameter) is preferably between 50-400% a layer thickness of the donor material, more preferably between 100-300%, even more preferably, between 150-250%. Typically, to provide well defined droplets, the beams have two dimensions that are approximately equal, e.g. a square or circular beam.

Typically, the mask pattern comprises a plurality of pattern areas having different sizes corresponding to different sizes of areas of the patterned structure to be formed. Accordingly, in one embodiment, the mask pattern is divided into separate pixels wherein a plurality of neighbouring pixels is arranged to form one pattern area of the plurality of pattern areas.

In one embodiment, the donor material is arranged on a face (side) of the donor substrate between the donor substrate and the acceptor substrate, i.e. facing away from the light source. In the embodiment, the donor substrate can be transparent to the light, i.e. the light can travel through the donor substrate until it impinges the donor material on one face thereof. By the light impinging the donor material, said material is released from the donor substrate and launched towards the acceptor substrate where it builds the patterned structure.

In one embodiment, the light source is a flash lamp, e.g. a (pulsed) xenon flash lamp. For example, in one embodiment, a high intensity pulsed xenon flash lamp is used in combination with a (lithographical) mask to transfer patterned inks from a donor film to a receiver film. Alternatively a mask may be used to pattern the donor by exposing and washing remaining non exposed ink. Advantageously, this solution can use existing patterning knowledge developed for photo-lithographical exposure. The resulting process can provide a contactless mask based direct partnering method. It will be appreciated that, high powered laser pulses are able to expel material from a donor film to a receiver film. It is now found that a more affordable light source such as conventional xenon lamp can be used for this purpose. A further advantage over LIFT is that the entire pattern can be transferred simultaneously. To properly obtain transfer material with a conventional light source a short duration and high power light source is desired.

In one embodiment, the light comprises a modulated pulse wherein the modulation comprises a first and a second time interval wherein, in the first time interval, the modulated pulse has a first light intensity for releasing the donor material and wherein, in the second time interval, the modulated pulse has a second light intensity for drying, melting, and/or sintering the donor material while the donor material is in transit between the donor substrate and acceptor substrate. It is presently recognized that, a modulated pulse can be used to ablate, dry and sintering (melt) the transferred drop during flight. Because the drop does not undergo any heat sinking, it can be very efficiently heated to extremely high temperatures. The gap between the substrates and drop velocity may determine the time frame of the pulse. For example, depending on the distance, in one embodiment, the first time interval is less than 50 µs and the second time interval is more than 100 µs. Preferably, the first light intensity is higher than the second light intensity. By using a longer pulse, the additional energy (apart from the energy used for release of the donor material) can be used to efficiently heat the transferred drop.

In one embodiment, a distance between the donor substrate and acceptor substrate is more than 25 µm, preferably more than 100 µm. By having sufficient distance, the donor material can be further heated by the light while in transit between the substrates. In a further embodiment, a distance between the donor substrate and acceptor substrate is less than 2 mm, preferably less than 1 mm, more preferably less than 500 µm. Having a smaller distance may improve accuracy of the placement of donor material.

In one embodiment, the donor substrate comprises a transparent substrate with a layer of donor material arranged thereon. In a further embodiment, the donor substrate comprises a releasing layer between the transparent substrate and the layer of donor material, wherein the releasing layer reacts under influence of the light for releasing the donor material from the donor substrate.

In a second aspect, the present disclosure provides a system for providing a patterned structure on a substrate. The system comprises a light source; means for providing an acceptor substrate for receiving the patterned structure; means for providing a donor substrate comprising a donor material, wherein the donor substrate is arranged between the light source and the acceptor substrate; and a mask arranged between the light source and the donor substrate. The mask comprises a mask pattern for patterning light from the light source impinging the donor substrate, wherein the patterned light matches the patterned structure to be created, wherein the patterned light impinging the donor substrate is adapted to cause the donor material to be released from the donor substrate and transfer to the acceptor substrate to form the patterned structure thereon. The patterned light is divided into a plurality of separate homogeneously sized beams simultaneously impinging the donor substrate for causing the donor material to be released from the donor substrate in the form of separate homogeneously sized droplets. The system according to the second aspect can be used to carry out the method according to the first aspect.

Further advantages and applications of the present methods and systems may include contactless patterning, large area, simultaneous transfer, high processing speeds, roll-to-roll compatibility, trench filling to avoid side leakage within OLEDs/OPV cells, placing solder bumps, low cost system compared to lasers, efficient energy use (possibly single pulse processing for patterning, drying and sintering). Furthermore, the pixelated mask can improve the patterning process. Moreover, as the method can work in both directions, additive and subtractive, the versatility of a single machine can increase. Apart from patterning and/or drying, one or more of the following aspects may be achieved by the same system:
1. High resolution and high aspect ratio patterning of a chip bond pad (<0.5 ms)
2. Photonic sintering of the conductive ink (~10 ms)
3. Placing solder bumps on the bond pad (<0.5 ms)
4. Photonic soldering after placing the chip (2 ms)
5. Trench filling to avoid side leakage (<0.5 ms).

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
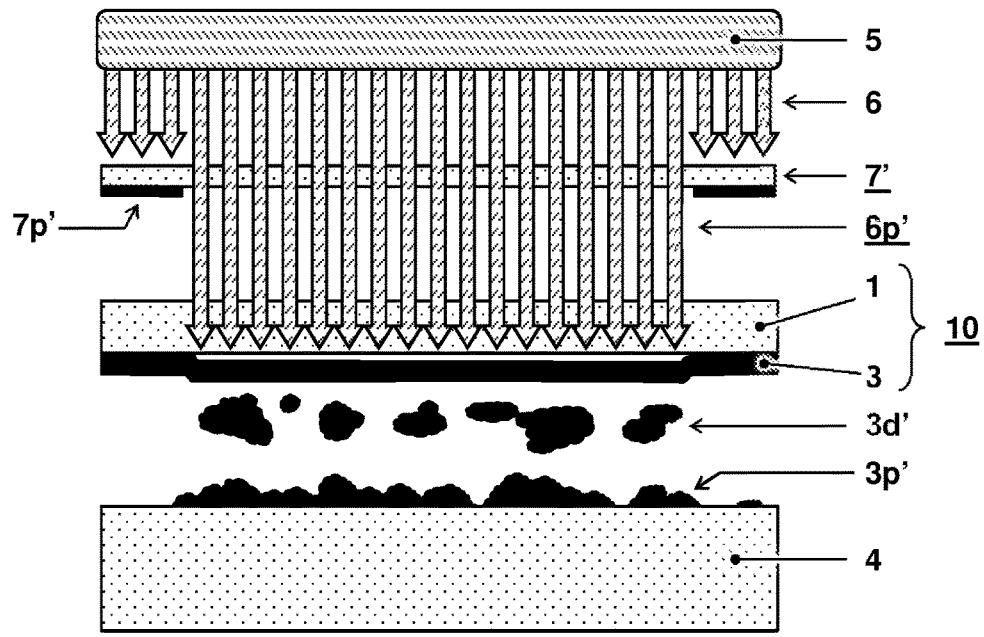
FIG. 1A shows a schematic illustration of a method for patterning large areas of material without the use of separated homogeneous light beams.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise. All publications, patent applications, patents, and other references mentioned herein are incorporated by reference in their entirety. In case of conflict, the present specification, including definitions, will control.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
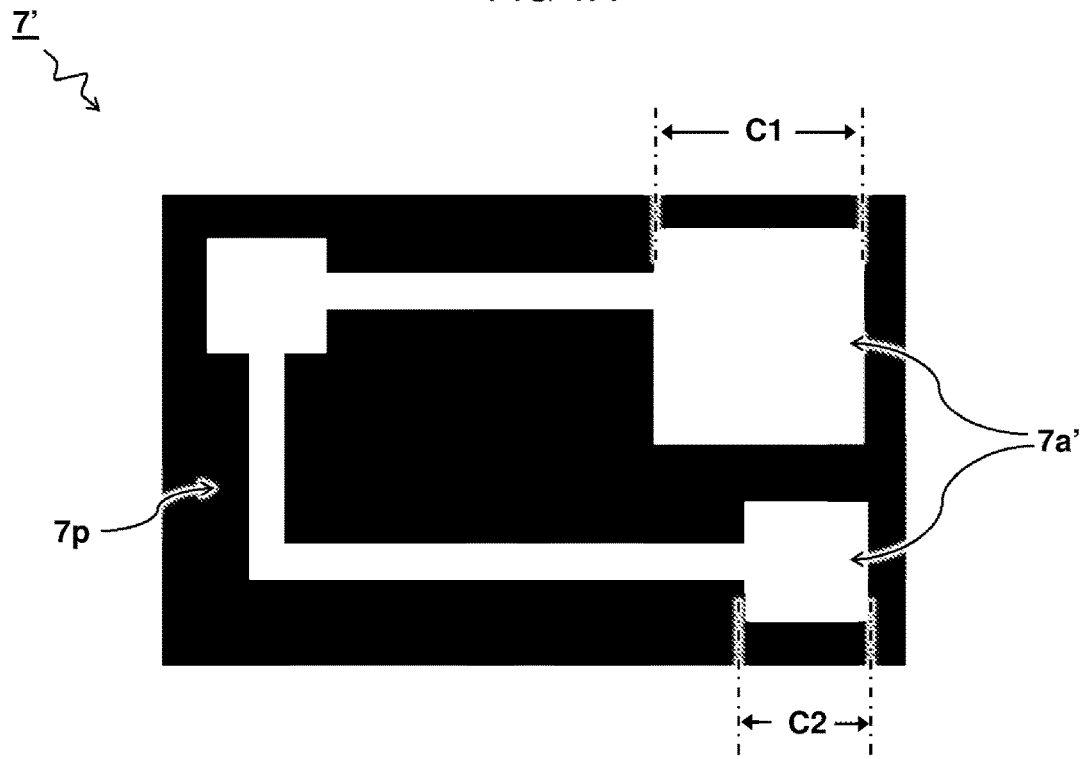
FIG. 1B shows an example of a circuit to be patterned having differently sized circuit patterns.

FIG. 1A shows a schematic illustration of a method for patterning large areas of material without the use of separated homogeneous light beams. A donor substrate 10 is arranged between a light source 5 and an acceptor substrate 4, wherein the donor substrate 10 comprises a donor material 3. A conventional mask 7' is arranged between the light source 5 and the donor substrate 10, wherein the mask 7' comprises a conventional mask pattern 7p' for patterning light 6 from the light source 5 impinging the donor substrate 10. The patterned light 6p' matches the patterned structure 3p to be created, e.g. a large continuous area 7a' of a circuit such as shown in FIG. 1B. Typically, in a circuit or corresponding mask pattern 7' such as shown, circuit parts 7a' may have different sizes C1, C2. When the patterned light 6p', e.g. comprising a large continuous beam, impinges the donor substrate 10, this may cause a large chunk of donor material 3 to be released from the donor substrate 10 and transfer to the acceptor substrate 4. However, because the area is so large, it can break up while in transit leading to the formation of debris 3d'. The debris 3d' forms an irregular patterned structure 3p' on the acceptor substrate 4.

Figure 2A:
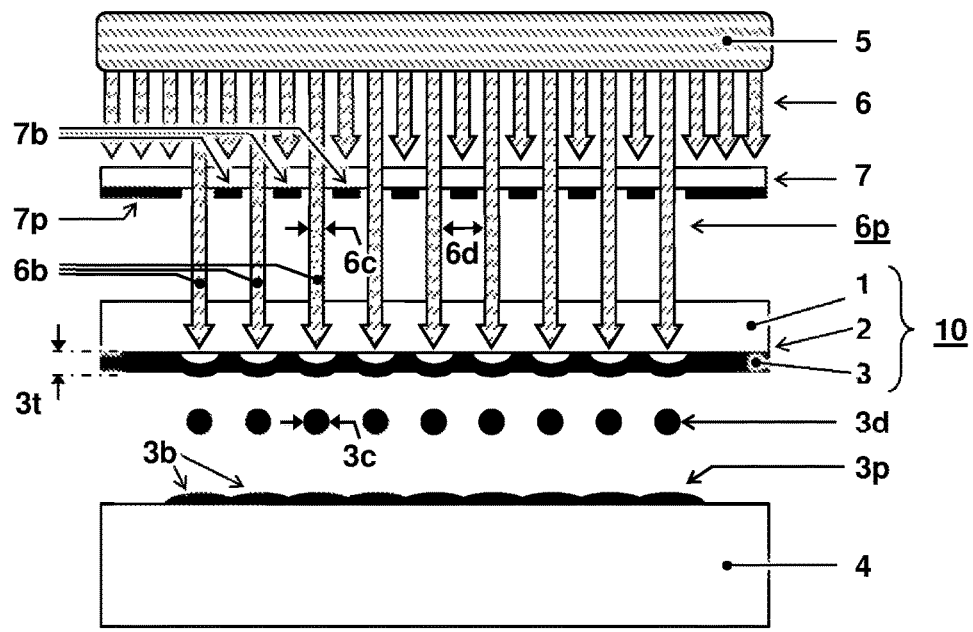
FIG. 2A shows a schematic illustration of a method for patterning large areas of material using separated homogeneous light beams.

FIG. 2A shown a schematic illustration of an embodiment for patterning large areas of material with the benefit of using separated homogeneous light beams. The method comprises providing a donor substrate 10 arranged between a light source 5 and an acceptor substrate 4, wherein the donor substrate 10 comprises a donor material 3. The method further comprises providing a mask 7 arranged between the light source 5 and the donor substrate 10. The mask 7 comprises a mask pattern 7p for patterning light 6 from the light source 5 impinging the donor substrate 10. The patterned light 6p matches the patterned structure 3p to be created. In particular, the patterned light 6p impinging the donor substrate 10 causes the donor material 3 to be released from the donor substrate 10 and transfer to the acceptor substrate 4 to form the patterned structure 3p thereon. Advantageously, the patterned light 6p is divided into a plurality of separate homogeneously sized beams 6b simultaneously impinging the donor substrate 10. This causes the donor material 3 to be released from the donor substrate 10 in the form of separate homogeneously sized droplets 3d.

As described herein, preferably, the beams are homogeneously sized, i.e. they have approximately the same size, e.g. cross-section or (maximum) diameter of the beams. Preferably, all beam diameter sizes are within a margin of +/−30% of the mean beam diameter size, preferably within a margin of +/−20% or even +/−10%. The smaller the spread of beam sizes, the more homogeneous can be the resulting droplet sizes. Alternatively or in addition to the approximate equal beam sizes, preferably, the energy per beam is preferably also approximately equal, e.g. within 30% margin.

Preferably, neighbouring beams 6b are homogeneously distanced 6d for depositing the droplets 3d at homogeneous distances onto the acceptor substrate 4, wherein an interconnecting patterned structure 3p is formed by the transferred droplets spreading on the acceptor substrate 4 and connecting to neighbouring transferred droplets.

As described herein, preferably, the beams are homogeneously distanced, i.e. neighbouring beams that are together forming a pattern have a distance between the beams that is within a margin of 30% of a mean distance, preferably within 20% or even 10%. The smaller the spread in distances, the more predictable can be the behaviour of the transfer and subsequent spreading of the droplets on the substrate.

In one embodiment, a desired spreading and interconnecting is achieved by a separation distance 6d between neighbouring beams that is between 50-150% a size 6c of the beams. With reference to the mask of FIG. 2B, this means that a separation distance X2 between pixels is preferably between 10-150% a size X1 of the pixels.

In one embodiment the mask pattern 7p is divided into separate pixels P wherein a plurality of neighbouring pixels P is arranged to form one pattern area of the plurality of pattern areas 7a. In another or further embodiment, the light is divided into separate beams by a second mask (not shown).

In one embodiment, a desired droplet formation is achieved by a size 6c of beams 6b impinging the donor substrate 10 that is between 150-250% a layer thickness 3t of the donor material 3 on the donor substrate 10. Typically, a size, e.g. diameter 3c of the droplets 3d can be on the order of the size, e.g. diameter 6c of the beams 6b. With reference to the mask of FIG. 2B, this means that a size X1 of the pixels is preferably between 150-250% a layer thickness 3t of the donor material 3

In one embodiment, the light source 5 comprises a flash lamp, e.g. Xenon based. Preferably, the light 6 is provided to the mask as a collimated beam. Alternatively, the mask can be provided in an object plane of an imaging system (not shown) to image the mask pattern onto the donor substrate 10.

In one embodiment, the donor substrate 10 comprises a transparent substrate 1 with a layer of donor material 3 arranged on a face thereof between the donor substrate 10 and acceptor substrate 4. The donor substrate is preferably of a flexible material, e.g. comprise a PEN foil of 25 μm thickness. The donor material may e.g. comprise a conductive ink or other material to build the patterned structure.

In one embodiment, the donor substrate 10 comprises an optional releasing layer 2 between a transparent substrate 1 and the layer of donor material 3. In a further embodiment, the releasing layer 2 reacts under influence of the light 6 for releasing the donor material 3 from the donor substrate 10. For example, the release may be effected by a sudden rise in heat and resulting expansion of the release layer material. For example, a shock wave may travel through the material and cause the formation of a droplet. Also other mechanisms of release can be envisaged either with or without a release layer.

In one embodiment, the present methods may combined with other steps, e.g. patterning of a chip bond pad; photonic sintering of conductive ink; placing solder bumps on a bond pad; photonic soldering after placing a chip; trench filling to avoid side leakage.

In one embodiment, the present methods and systems result in a substrate 4 comprising a pattern 3p which is composed of a plurality of homogenously distanced and homogeneously sized interconnecting bumps 3b. The bumps 3b may correspond to the individual droplets 3d that have spread out on the substrate forming the interconnecting pattern 3p. In one embodiment, the pattern 3p is a circuit pattern, e.g. forming a conductive electronic circuit.

Figure 2B:
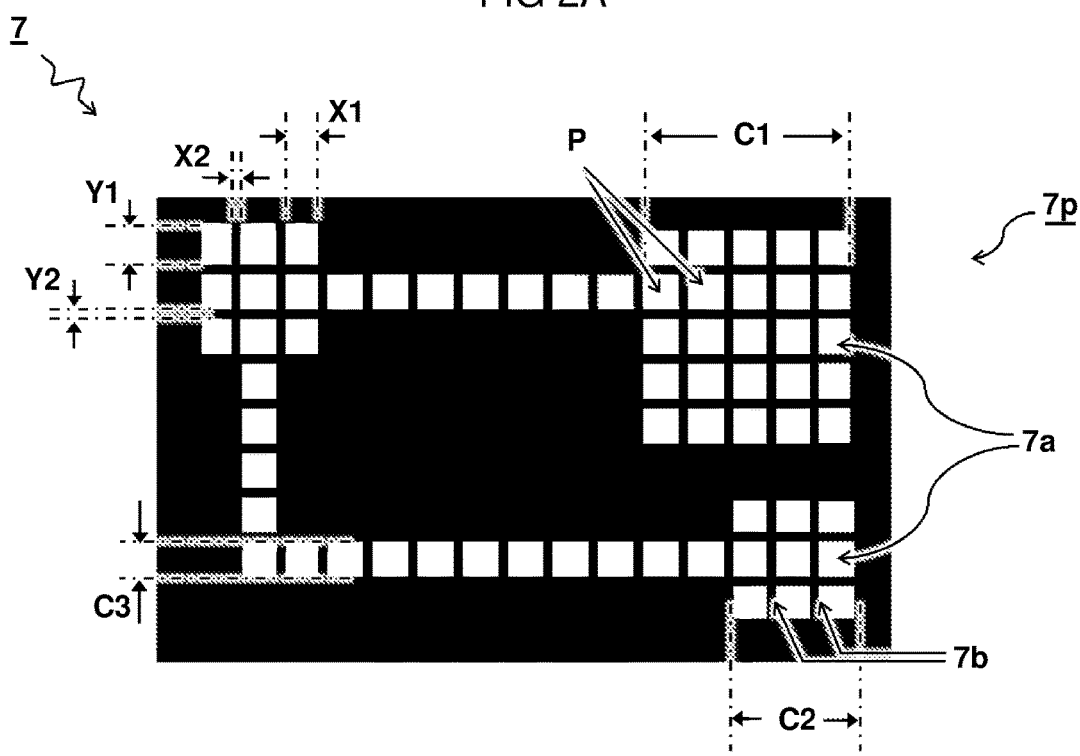
FIG. 2B shows the circuit of FIG. 1A but divided into a plurality of homogeneously sized pixels.

FIG. 2B illustrates a mask 7 wherein the mask pattern 7p comprises a plurality of pattern areas 7a having different sizes C1,C2,C3 corresponding to different sizes of areas or connecting paths of the patterned structure 3p to be formed. Accordingly the light that is patterned by a pattern area 7a is divided into a plurality of separate homogeneously sized neighbouring beams 6b which neighbouring beams form an interconnected area of the patterned structure 3p on the acceptor substrate 4. In one embodiment, the resulting patterned structure 3p is a circuit pattern comprising circuit parts having different dimensions.

It will be noted that the pixelated mask causes the light to be patterned on the donor substrate in a pattern comprising a plurality of separated pixels for regulating a size of material released from the donor substrate by the light. In this way a desirable drop formation can be achieved as opposed to irregular and/or uncontrolled breakup of the donor layer that was shown in FIG. 1A.

In one embodiment, the mask pattern 7p comprises a plurality of pattern areas 7a having different sizes C1,C2 corresponding to different sizes of areas of the patterned structure 3p to be formed, wherein the mask pattern 7p is divided into separate pixels P wherein a plurality of neighbouring pixels P is arranged to form one pattern area of the plurality of pattern areas 7a. In one embodiment, the mask pattern 7p comprises a plurality of pixels P having homogenous sizes X1,Y1. In one embodiment, the mask pattern 7p comprises a plurality of pixels P having homogenous distances X2,Y2.

In one embodiment, the mask 7 is produced by receiving a mask pattern 7p comprising a plurality of pattern areas 7a having different sizes C1,C2 corresponding to differently sized circuit elements to be formed; and dividing the pattern areas 7a into a plurality of separate homogeneously sized pixels. In one embodiment, the pattern areas 7a are divided into pixels P by a grid 7b between the pixels. In one embodiment, each pixel has a pixel diameter smaller than 200 μm, preferably, smaller than 150 μm, more preferably smaller than 100 μm.

Preferably, the beams have first dimension and second dimensions X1,X2 that are approximately equal to provide a properly formed drop, e.g. the beam can be square or circular. Accordingly, in the mask pattern, the pixels P preferably have a first dimension X1 and a transverse second dimension Y1 which is approximately equal to the first dimension X1, e.g. within a margin of +/−20%.

Figure 3A:
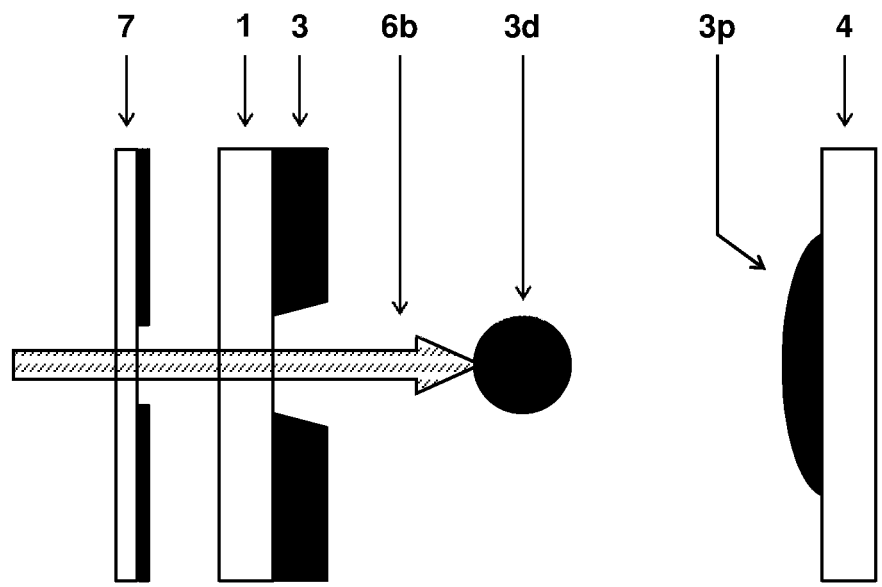
FIG. 3A illustrates an embodiment using a modulated pulse.

FIG. 3A illustrates an embodiment using a modulated pulse. It can be noted that the modulated pulse can be transmitted through the donor substrate to impinge the released droplet of donor material while it is in transit between the donor and acceptor substrates. The pulse may optionally continue to irradiate the donor material also after the droplet has landed on the acceptor substrate. Instead of a single pulse, also multiple pulses can be used, to on the one hand release the donor material and on the other hand irradiate the droplet while in transit and/or after landing.

In particular, the figure shows a light beam 6b that passes a mask 7 to impinge onto a donor substrate comprising a transparent substrate 1 with donor material 3 thereon. When the light beam impinges the donor material 3, a droplet 3d is ejected from the donor substrate and travels towards the acceptor substrate 4. When the droplet 3d arrives at the acceptor substrate 4, it spreads out, e.g. depending on a size, velocity and viscosity of the droplet 3d. In the embodiment, the light beam 6b not only causes the material 3 to eject from the donor substrate but also impinges the formed droplet while it is in transit and/or after it has arrived on the acceptor substrate 4.

Figure 3B:
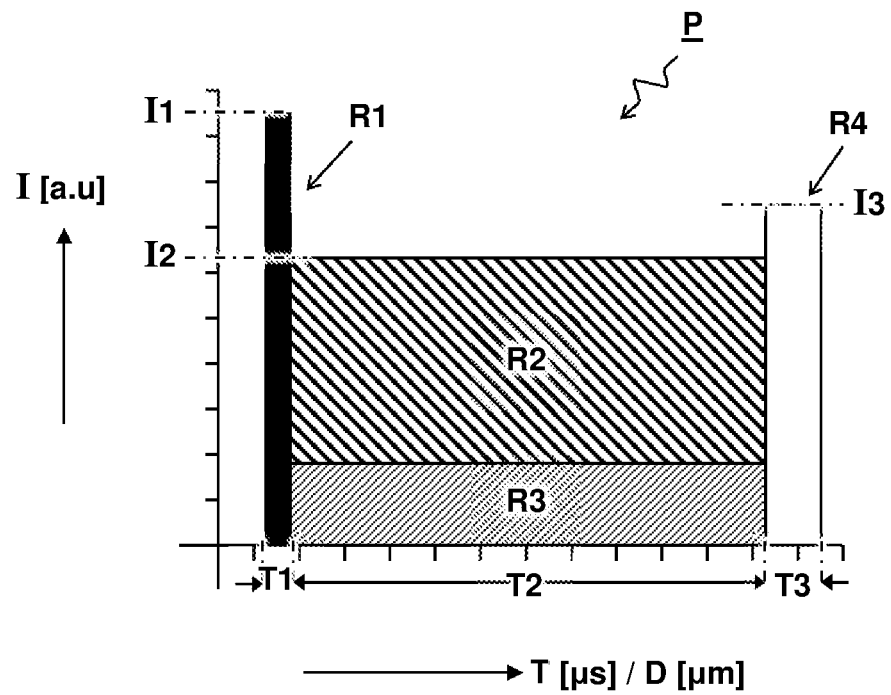
FIG. 3B shows a graph of a modulated pulse wherein light intensity is shown as a function of time or distance travelled by the droplet.

FIG. 3B shows a graph of a modulated pulse P wherein light intensity I is shown as a function of time T or distance D travelled by the droplet. In one embodiment, the modulation comprises a first time interval T1 and a second time interval T2 that is longer than the first time interval T1. In the first time interval T1, the modulated pulse has a first light intensity I1 for releasing the donor material. Typically, this region R1 comprises a short intense pulse, e.g. on the order of microseconds at an intensity of 3 kW/cm^2. In the second time interval T2 covering regions R2 and R3, the modulated pulse has a second light intensity I2 that is lower than the first light intensity I1 for drying, melting, and/or sintering the donor material while the donor material is in transit between the donor substrate and acceptor substrate. For example, the second light intensity can be about half the first light intensity. The second time interval may depend on the time it takes for the droplet to transfer to the acceptor substrate. In one embodiment, the first time interval is less than 50 µs and the second time interval is more than 100 µs.

In another or further embodiment, the modulation comprises a third time interval T3 in a region R4 having a third light intensity I3 for influencing the formation of the pattern 3p on the acceptor substrate 4. It will be noted that in such an embodiment, the light pulse is typically longer than needed purely for the release of the donor material 3. The third intensity can also be equal to the second intensity. A typical pulse may deliver a total energy of 3 J/cm^2 in a total pulse time of 2 ms. For example, the regions R1,R2,R3, and R4 may correspond to different processes, e.g. ablation, melting, drying, and sintering respectively.

In one embodiment, wherein a distance between the donor substrate and acceptor substrate is more than 10 µm, preferably more than 100 µm. The distance is preferably large enough to allow the droplet to be sufficiently irradiated while in transit. In one embodiment a distance between the donor substrate and acceptor substrate is less than 2 mm, preferably less than 1 mm. The distance is preferably small enough to prevent deviations of the path of the droplet to deteriorate the resolution of the patterning.

Figure 4:
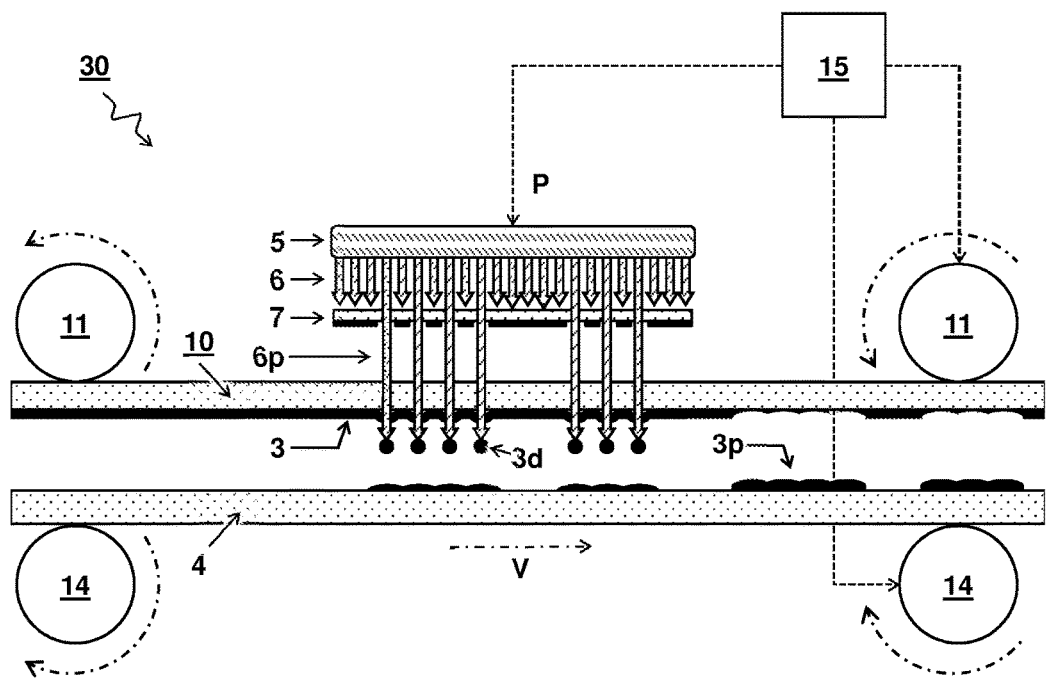
FIG. 4 illustrates an embodiment of a system for providing a patterned structure on a substrate.

FIG. 4 illustrates an embodiment of a system 30 for providing a patterned structure 3p on a substrate. The system 30 comprises a light source 5. The system further comprises means 14 for providing an acceptor substrate 4 for receiving the patterned structure 3p. Said means 14 may e.g. comprise a substrate transporter comprising rolls to produce the patterned structure in continuous manner, e.g. in a roll-to-roll or roll-to-sheet process. The system further comprises means 11 for providing a donor substrate 10 comprising a donor material 3, wherein the donor substrate 10 is arranged between the light source 5 and the acceptor substrate 4. The means 11 may e.g. comprise a transporter system for carrying the substrate 10. The system further comprises a mask 7 arranged between the light source 5 and the donor substrate 10. The mask 7 comprises a mask pattern for patterning light 6 from the light source 5 impinging the donor substrate 10. The patterned light 6p matches the patterned structure 3p to be created, wherein the patterned light 6p impinging the donor substrate 10 is adapted to cause the donor material 3 to be released from the donor substrate 10 and transfer to the acceptor substrate 4 to form the patterned structure 3p thereon. The patterned light 6p is divided into a plurality of separate homogeneously sized beams 6b simultaneously impinging the donor substrate 10 for causing the donor material 3 to be released from the donor substrate 10 in the form of separate homogeneously sized droplets 3d. The system may be used to carry out the methods described herein.

In one embodiment, a velocity V of the transporters 11, 14 and a pulse modulation P of the light source 5 is controlled by a controller 15 such that a complete pattern 3p is formed on the acceptor substrate 4 by a single light pulse or pulse train. In other words, the transporters 11 and 14 move the donor and acceptor substrates at such a velocity that for each light pulse generated by the light source, the substrates have shifted to a new position to generate a next pattern.

One embodiment of the system comprises one or more of the following components:
- Light pulse: Broad banded flash lamp. Modulated to control temperature of the transferred drop.
- Optics: Collimated light beams preferred to obtain high edge sharpness and high resolution
- Pixelated mask: Photolithographed metal on glass. Aluminium or chrome to reduce the light absorption and the chance of ablation.
- Alignment (optional): For placing solder bumps and the filling of trenches, an alignment system is preferred.
- Substrate: Polymer films, glass. Transparent for the light
- Ink: Solvent based inks which have a high absorbance with respect to the lamps emission spectrum. Shear thinning pastes should work, as well as low viscous inks.
- Acceptor substrate: Any kind. The gap between the acceptor and donor is important for temperature/time profile of the transferred drop.

Figure 5A:
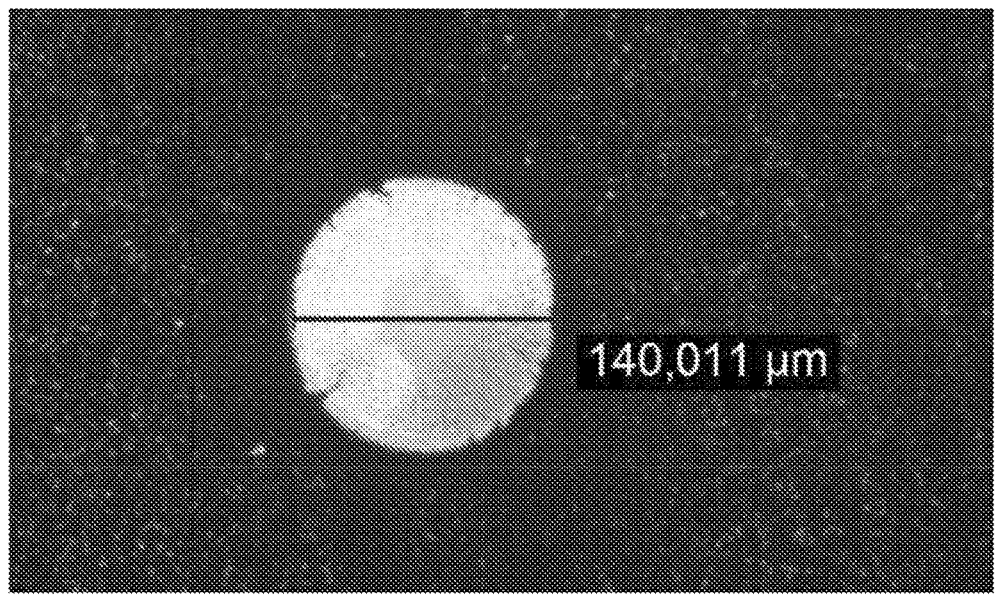
FIGS. 5A and 5B show photographs of deposited droplets.
Figure 5B:
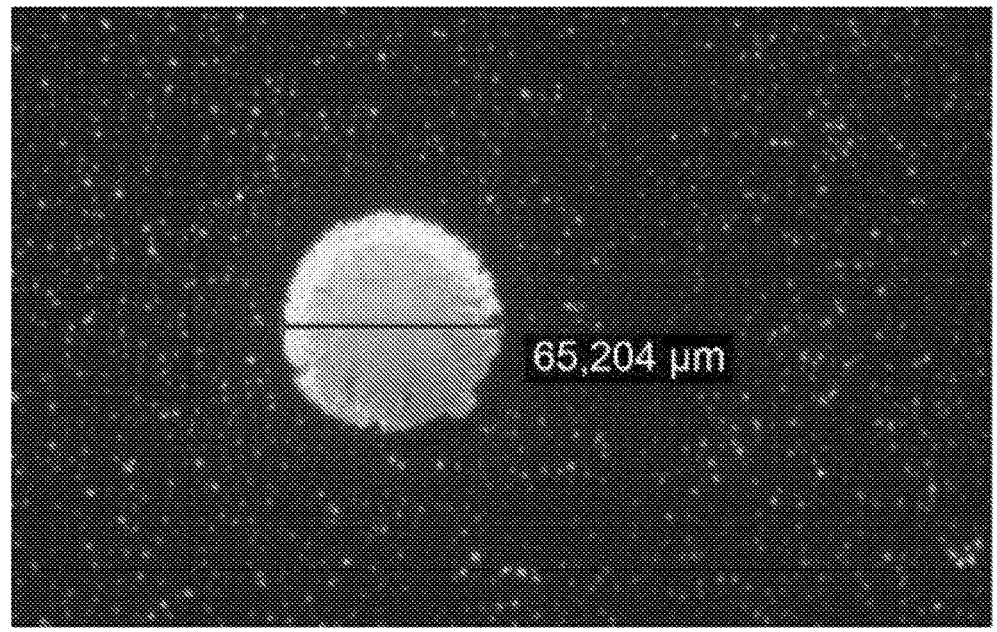

For example the following configuration can be used:
Lamp equipment: Xenon Sinteron® 2000
Pulse: 500 µs, ~5 J/cm2, 1 pulse
Mask: Chromium (100 nm) on eagle glass (0.7 mm)
Donor: PEN, 25 µm thick
Ink: DuPont X115, sub-micron screen print paste
Gap: 600 µm
Acceptor substrate: Glass, 1.1 mm FIGS. 5A and 5B show photographs of deposited droplets using the methods and systems similar to the above described configuration.

Another embodiment comprises one or more of the following components and/or aspects:
- Light source: Xenon flash lamp. High energy and short pulses (<<500 µs) preferred for optimal results.
- Mask: Photolithographed metal on glass. Aluminium or chrome to reduce light absorption and the chance of ablation.
- Donor substrate: Polymer films, glass. Transparent for the light
- Ink: Solvent based inks which have a high absorbance with respect to the xenon emission spectrum. The viscosity can vary, but for example the transfer of solid materials can be more difficult.
- Releasing layer: Degradation of this layer can expel the ink towards the acceptor substrate. This layer can improve the process and it might even be possible to transfer complete (OLED/OPV) stacks.
- Acceptor substrate: Any kind. Distance between the donor and acceptor substrate can be set, e.g. in view of using a modulated pulse.

For example the following configuration can be used:
Lamp equipment: Xenon Sinteron® 2000
Pulse: 500 µs, ~4 J/cm2, 1 pulse
Mask: Aluminium (100 nm) on eagle glass (0.7 mm)
Donor substrate: Eagle glass and PEN
Inks: DuPont® 5025 and Suntronic® U5714
Acceptor substrate: PEN film (125 µm)
Gap: 1 mm As described herein, a first aspect of the present disclosure provides a method for providing a patterned structure on an acceptor substrate, the method comprising providing a donor substrate between a light source and the acceptor substrate, wherein the donor substrate comprises a donor material to form the patterned structure; wherein a mask is arranged between the light source and the donor substrate for patterning light from the light source impinging the donor substrate, wherein the patterned light causes the donor material to release from the donor substrate and transfer to the acceptor substrate. A second aspect of the present disclosure provides a system for providing a patterned structure on an acceptor substrate, the system comprising means for providing the acceptor substrate a light source; means for providing a donor substrate arranged between the light source and the acceptor substrate, the donor substrate comprising a donor material to form the patterned structure; and a mask arranged between the light source and the donor substrate for patterning light from the light source impinging the donor substrate, wherein the patterned light causes the donor material to release from the donor substrate and transfer to the acceptor substrate.

While example embodiments were shown for methods and systems for forming patterned structures, also alternative ways may be envisaged by those skilled in the art having the benefit of the present disclosure for achieving a similar function and result. E.g. the aspects of using a pixelated mask, modulated pulse, flash lamp light source, etcetera may be combined or split up into one or more alternative aspects. The various elements of the embodiments as discussed and shown offer certain advantages, such as contactless patterning of material over large areas. Of course, it is to be appreciated that any one of the above embodiments or processes may be combined with one or more other embodiments or processes to provide even further improvements in finding and matching designs and advantages. It is appreciated that this disclosure offers particular advantages to patterning of conductive structures, and in general can be applied for any application wherein a material is to be patterned over relatively large areas.

While the present systems and methods have been described in particular detail with reference to specific exemplary embodiments thereof, it should also be appreciated that numerous modifications and alternative embodiments may be devised by those having ordinary skill in the art without departing from the scope of the present disclosure. For example, embodiments wherein devices or systems are disclosed to be arranged and/or constructed for performing a specified method or function inherently disclose the method or function as such and/or in combination with other disclosed embodiments of methods or systems. Furthermore, embodiments of methods are considered to inherently disclose their implementation in respective hardware, where possible, in combination with other disclosed embodiments of methods or systems. Furthermore, methods that can be embodied as program instructions, e.g. on a non-transient computer-readable storage medium, are considered inherently disclosed as such embodiment.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. Method for providing a patterned structure on a substrate, the method comprising
   providing a donor substrate arranged between a light source and an acceptor substrate, wherein the donor substrate comprises a donor material;
   providing a mask arranged between the light source and the donor substrate, wherein the mask comprises a mask pattern for patterning light from the light source impinging the donor substrate, wherein the patterned light matches the patterned structure to be created, wherein the patterned light impinging the donor substrate causes the donor material to be released from the donor substrate and transfer to the acceptor substrate to form the patterned structure thereon; wherein
   the patterned light is divided into a plurality of separate homogeneously sized beams simultaneously impinging the donor substrate for causing the donor material to be released from the donor substrate in the form of separate homogeneously sized droplets;
   wherein the mask pattern comprises a plurality of pattern areas having different sizes corresponding to different sizes of areas of the patterned structure to be formed, wherein the light that is patterned by a pattern area of the plurality of pattern areas is divided into a plurality of separate homogeneously sized neighbouring beams which neighbouring beams form an interconnected area of the patterned structure on the acceptor substrate.

2. Method according to claim 1, wherein the mask is produced by
   receiving a mask pattern comprising a plurality of pattern areas having different sizes corresponding to differently sized circuit elements to be formed; and
   dividing the pattern areas into a plurality of separate homogeneously sized pixels.

3. Method according to claim 1 wherein the beams are homogeneously distanced for depositing the droplets at homogeneous distances onto the acceptor substrate, wherein an interconnecting patterned structure is formed by the transferred droplets spreading on the acceptor substrate and connecting to neighbouring transferred droplets.

4. Method according to claim 1, wherein a diameter of each of the beams impinging the donor substrate is 150-250% times a layer thickness of the donor material on the donor substrate.

5. Method according to claim 1, wherein a separation distance between neighbouring beams is between 10-150% a size of the beams.

6. Method according to claim 1, wherein the beams are square or circular.

7. Method according to claim 1, wherein the light source comprises a flash lamp.

8. Method according to claim 1, wherein the light comprises a modulated pulse wherein the modulation comprises a first time interval and a second time interval that is longer than the first time interval wherein, in the first time interval, the modulated pulse has a first light intensity for releasing the donor material and wherein, in the second time interval, the modulated pulse has a second light intensity that is lower than the first light intensity for drying, melting, and/or sintering the donor material while the donor material is in transit between the donor substrate and acceptor substrate.

9. Method according to claim 1, wherein the donor substrate comprises a transparent substrate with a layer of donor material arranged on a face thereof between the donor substrate and acceptor substrate.

10. Method according to claim 1, wherein the donor substrate comprises a releasing layer between a transparent substrate and the layer of donor material, wherein the releasing layer reacts under influence of the light for releasing the donor material from the donor substrate.

* * * * *